United States Patent [19]

Schwabe et al.

[11] 4,434,543
[45] Mar. 6, 1984

[54] PROCESS FOR PRODUCING ADJACENT TUBS IMPLANTED WITH DOPANT IONS IN THE MANUFACTURE OF LSI COMPLEMENTARY MOS FIELD EFFECT TRANSISTORS

[75] Inventors: Ulrich Schwabe, Munich; Erwin Jacobs, Vaterstetten, both of Fed. Rep. of Germany

[73] Assignee: Siemens Aktiengesellschaft, Berlin and Munich, Fed. Rep. of Germany

[21] Appl. No.: 438,903

[22] Filed: Nov. 2, 1982

[30] Foreign Application Priority Data

Dec. 11, 1981 [DE] Fed. Rep. of Germany ....... 3149185

[51] Int. Cl.³ ............... H01L 21/263; H01L 21/22; B01J 17/00
[52] U.S. Cl. ................................. 29/576 B; 29/571; 148/1.5; 357/23; 357/42; 357/91
[58] Field of Search ............ 29/576 B, 571; 148/1.5; 357/42, 23 CS, 91

[56] References Cited

U.S. PATENT DOCUMENTS

| | | | |
|---|---|---|---|
| 4,013,484 | 3/1977 | Boleky et al. | 148/1.5 |
| 4,244,752 | 1/1981 | Henderson, Sr. et al. | 148/1.5 |
| 4,268,321 | 5/1981 | Meguro | 148/1.5 |
| 4,282,648 | 8/1981 | Yu et al. | 29/571 |
| 4,315,781 | 2/1982 | Henderson | 148/1.5 |
| 4,382,827 | 5/1983 | Moran et al. | 148/1.5 |
| 4,385,947 | 5/1983 | Halfacre et al. | 29/576 B |
| 4,391,650 | 7/1983 | Pfeifer et al. | 148/1.5 |

OTHER PUBLICATIONS

DeWitt Ong, IEEE Transact. Electr. Dev., vol. ED-28, (1981), pp. 6–12.
Parillo et al, TEDM Technical Digest, (1980), pp. 752–755.
Y. Sakai et al, Jap. J. Appl. Phys. vol. 18, Suppl. 18-1, (1978), pp. 73–78.
Matamedi et al, IEEE Transact. Electr. Dev., vol. ED-27, (1980), pp. 578–583.

Primary Examiner—Upendra Roy
Attorney, Agent, or Firm—Hill, Van Santen, Steadman & Simpson

[57] ABSTRACT

The invention provides a method for manufacturing adjacent tubs implanted with dopant material ions in the manufacture of LSI complementary MOS field effect transistor circuits (CMOS circuits), and also provides a method sequence for a CMOS process adapted to tub manufacture. In accordance with the principles of the invention, for the greatest possible spatial separation of the tubs, a p-tub (5) is produced before a n-tub (8) and an undercutting (25) of a nitride layer (4) serving as the implantation mask in the p-tub production is intentionally produced, so that, during a subsequent oxidation, the edge of the oxidation is shifted toward the outside by about 1 to 2 μm. Further, the penetration depth $x_{jn}$ of the n-tub (8) is set smaller by a factor at least equal to 4 relative to the penetration depth $x_{jp}$ of the p-tub (5), whereby the thickness of the n-doped epitaxial layer (2) and the penetration depth $x_{jp}$ are about matched to one another. The two tubs are separately implanted and diffused. As a result of the inventive sequences, the disadvantages of mutual, extensive compensation of the p-tub and the n-tub are avoided.

15 Claims, 9 Drawing Figures

PROCESS FOR PRODUCING ADJACENT TUBS IMPLANTED WITH DOPANT IONS IN THE MANUFACTURE OF LSI COMPLEMENTARY MOS FIELD EFFECT TRANSISTORS

BACKGROUND OF THE INVENTION

1. Field of the Invention

The invention relates to LSI complementary MOS field effect transistors (CMOS circuits) and somewhat more particularly to an improved method of producing adjacent tubs implanted with dopant ions in the manufacture of such circuits.

2. Prior Art

In known methods for manufacturing LSI complementary MOS field effect transistors circuits (CMOS circuits), multiple implantations according to various techniques, which are very involved, are employed for defining the different transistor threshold voltages.

Thus, L. C. Parillo et al, "Twin Tub CMOS-A Technology for VLSI Circuits", *IEDM Technical Digest*, pages 752–755 (1980) suggest a process of producing two n- or, respectively, p- tubs in a CMOS process by self-adjusting process steps with the use of only one mask. With a standard penetration depth $x_j=5\mu m$ (n- and p- tubs), the self-adjusting implantation of two tubs leads to a high spatial overlap at the implantation edges and to a charge-wise compensation of the n- or p- implanted regions. A negative consequence of this is that the threshold voltage of the field oxide transistor is reduced and current amplification of the parasitic npn and pnp bipolar transistors is increased. This leads to an increasing "latch-up" susceptibility (which is the trigger probability of a parasitic thyristor). A substantial reduction of the thick oxide threshold voltage as well as "latch-up", lead to an outage of the particular component.

Another prior art technique which peforms both the two tub production as well as the channel and field implantation with the use of separate masks is suggested by Y. Sakai et al, "High Packing Density, High Speed CMOS (Hi-CMOS) Device Technology", *Japanese Journal of Applied Physics*, Vol. 18, Supplement 18-1, pages 73–78 (1978). A disadvantage of this technique is that the CMOS manufacturing process, already critical in terms of yield, is further burdened by a plurality of required masking steps.

SUMMARY OF THE INVENTION

The invention provides a method for producing adjacent troughs or tubs implanted with dopant ions in the manufacture of LSI complementary MOS field effect transistor circuits (CMOS circuits), in which n-doped or, respectively, p-doped tubs, for the acceptance of a p- or, respectively, n- channel transistor of the circuit in a silicon substrate, are generated in an epitaxial layer applied onto the substrate. Corresponding dopant material ions are introduced in the tubs for setting or defining the various transistor threshold voltages by multiple ion implantation, with the masking for the individual ion implantations occurring by means of appropriate structures composed of photosensitive resist and/or silicon oxide and/or silicon nitride.

The invention provides a technique for executing a CMOS process in which as few process steps as possible are utilized for manufacturing desired circuits, but which process nevertheless guarantees that the functioning manner of the respected components in the circuit is not vitiated.

All of the earlier noted prior art disadvantages are avoided by following the principles of the invention and executing a sequence of the following steps:

(a) producing a p-tub by a boron ion implantation in an n-doped epitaxial layer applied onto a $n^+$-doped substrate and covered with an oxide layer, after completion of masking of remaining regions with a silicon nitride mask;

(b) stripping the oxide layer while undertaking a deliberate underetching of silicon nitride layer;

(c) conducting a local oxidation process and diffusing the implanted boron ions down to a penetration depth, $x_{jp}$, which lies in the range of the thickness of the epitaxial layer;

(d) stripping the silicon nitride masking;

(e) producing a n-tub by a phosphorous or arsenic ion implantation and subsequently diffusing the so-implanted ions to a significantly lower penetration depth, $x_{jn}$, than that of the p-tub ($x_{jp}$) so that $x_{jp}$ is equal to or larger than $4\, x_{jn}$.

In contrast to the earlier described Parillo et al process, with the invention the p-tub is implanted before the n-tub and is subsequently diffused in, down to the depth $x_{jp}$. It is a significant feature of the invention that the thickness of the epitaxial layer is selected so as to be equal or only slightly larger than the penetration depth $x_{jp}$ for the p-tub. A further significant difference in comparison to the known Parillo et al process, is that with the invention, the n-tub penetration depth $x_{jn}$ is lower by a factor of at least 4. In an exemplary embodiment, the penetration depth $x_{jp}$ is about 6 $\mu m$, while the penetration depth $x_{jn}$ ranges between about 1 to 1.5 $\mu m$, with the n-tub being implanted and diffused-in or driven-in separately from the p-tub. In this manner, the disadvantages avoided are the mutual, extensive compensation of the p- and n- tubs which occur with a simultaneous p- and n- diffusion and practically identical penetration depths, $x_{jp} \approx x_{jn}$ (as suggested by Parillo et al).

A further inventive feature for a spatial separation of the two tubs in the intentional large underetching of the nitride mask when stripping off the oxide layer. This causes the edge of a subsequent masking oxidation to be shifted toward the outside by about 1 to 2 $\mu m$ and the implantation of the n-tub is separated from the implantation edge of the p-tub by this distance.

Another means of achieving a separation of the tub implants in accordance with the principles of the invention is that as long as possible, a so-called bird's beak is formed in the local oxidation process after stripping off the oxide layer, instead of or in addition to the intentional underetching of the silicon nitride layer. The bird's beak also provides masking for the phosphorous ion implantation. The formation of such a bird's beak can be achieved by a high pressure oxidation process (at a pressure of about 1 to $2\times 10^6$ Pa) at relatively low temperatures (about 700° C.).

The n-tub is self-adjusting relative to the p-tub and can be produced both by a phosphorous as well as by an arsenic ion implantation. As a result of the relatively high implantation dose (typically $9\times 10^{11}$ ions per sq. cm), a field ion implantation is no longer required and the field ion implantation mask can eliminated. Thus, only *one* mask is required for defining the p-tub, the n-tub and the field region (p-channel).

DESCRIPTION OF PREFERRED EMBODIMENTS

Figure 1:
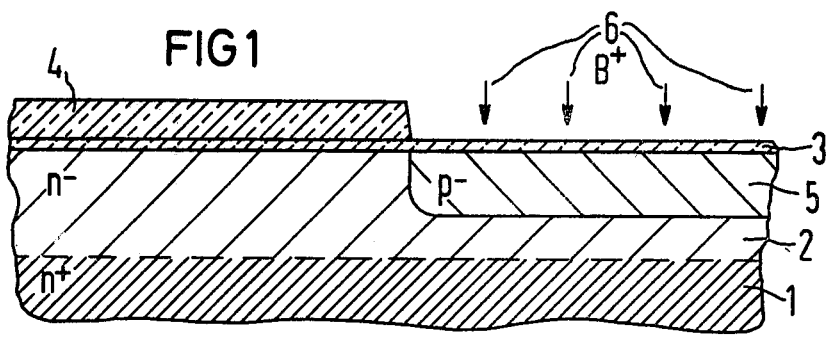
FIGS. 1-7 are partial, elevated, cross-sectional, somewhat schematic views of a circuit undergoing manufacture in accordance with the principles of the invention and illustrate structures attained by individual method steps essential to the invention, with a plurality of processes being illustrated in each figure for simplicity sake.
Figure 2:
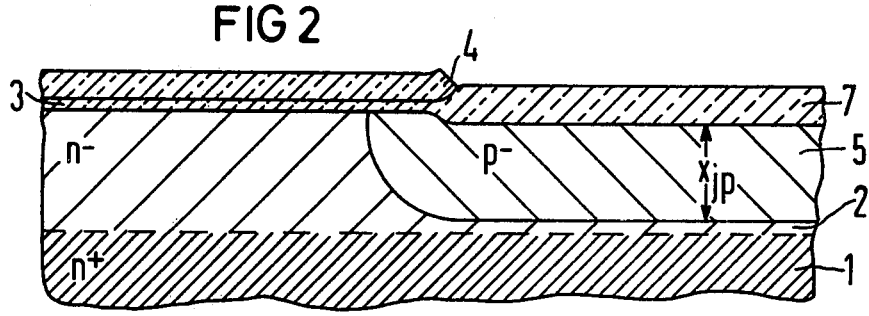

The invention will now be described in greater detail on the basis of an exemplary embodiment with reference to the execution of a twin tub process with a n-channel and a p-channel transistor. In the various drawings, identical reference numerals are utilized to identify the same parts throughout the various figures.

FIG. 1

A p-trough or tub 5 is produced at the beginning of the process sequence. In order to achieve this, one proceeds from a n+-doped substrate 1, typically comprised of silicon wafer orientated in the <100> direction, doped with anitmony and having a resistance of about 0.01 to 0.1 Ohm . cm. A n-doped epitaxial layer 2 (for example being <100> -Si with a resistance of about 10 to 50 Ohm . cm) is provided onto the substrate 1. An oxide layer 3 (50 nm) is provided on to the epitaxial layer 2 and a silicon nitride layer 4 (100 nm thick) is provided on to the oxide layer 3 and structured with the assistance of a photosensitive resist technique (not shown). Next, a boron ion implantation, schematically indicated at 6, for generating the p-tub 5 occurs at a dose of about $1.5 \times 10^{12} \text{cm}^{-2}$ and an energy level of about 160 keV.

FIG. 2

Figure 8:
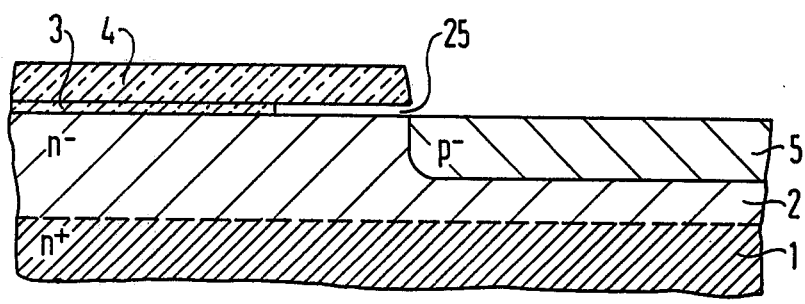
FIGS. 8 and 9 are somewhat similar detailed views illustrating the high degree of spatial separation of two tubs achieved by underetching of the nitride mask and subsequent oxidation masking in accordance with the principles of the invention.

After stripping the oxide layer 3, with an intentional underetching of the silicon nitride layer 4 being carried out, an oxidation process occurs (see FIG. 8). The newly generated oxide layer 7 has a thickness of about 400 nm. In a subsequent diffusion process, the boron ions are driven into the epitaxial layer 2 down to the penetration depth $x_{jp}$ of about 6 $\mu$m. The thickness of the epitaxial layer 2 is about 7 $\mu$m.

FIG. 3

Next, the silicon nitride layer 4 is removed. The production of the n-trough or tub 8 occurs by a surface-wide phosphorous (or arsenic) ion implantation, schematically indicated at 9, with an implantation dose of about $9 \times 10^{11} \text{cm}^{-2}$ and an energy level of about 160 keV, with a subsequent n-diffusion occurring to drive-in the implanted ions to a penetration depth $x_{jn}$ of about 1 to 1.5 $\mu$m. As a result of the high implantation dose, the field ion implantation for defining the threshold voltage of the p-channel thick oxide transistors can be eliminated as can, thus, an additional mask.

FIG. 4

Figure 4:
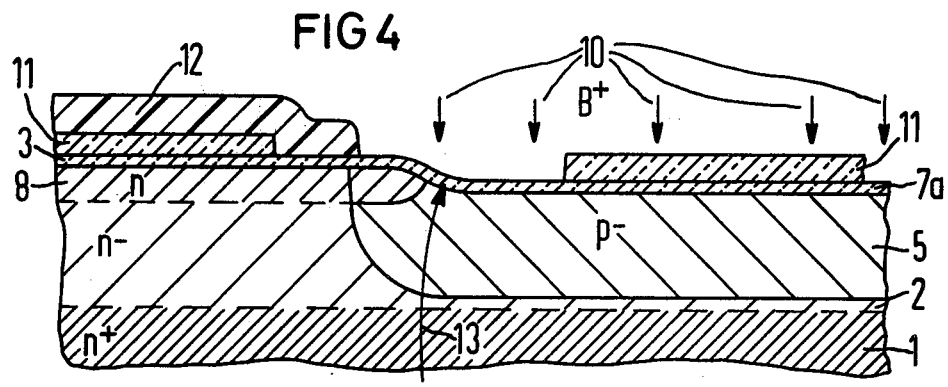
Figure 5:
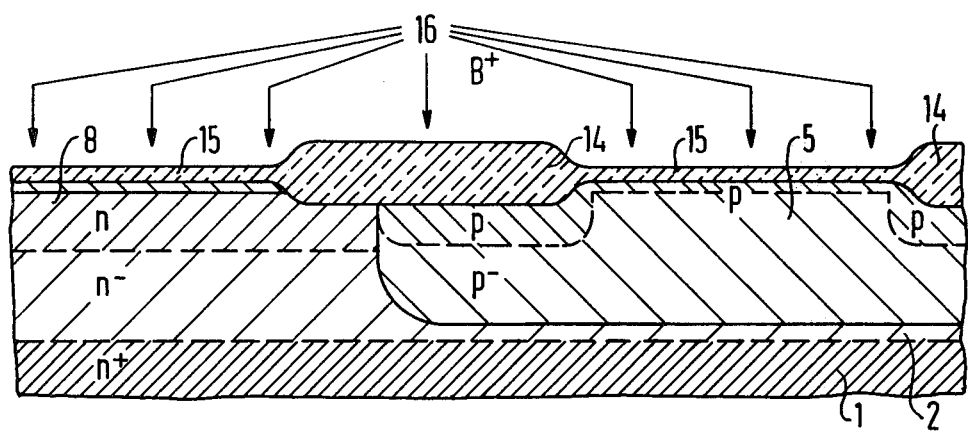
Figure 6:
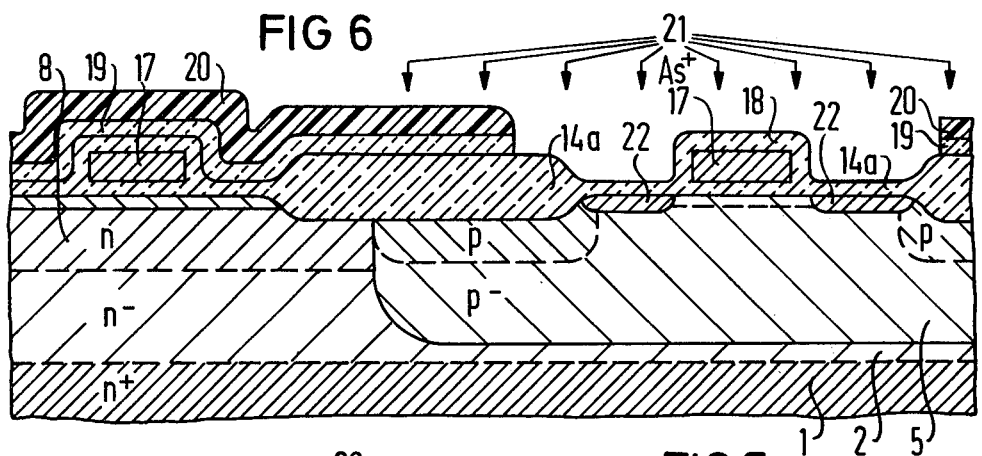
Figure 7:
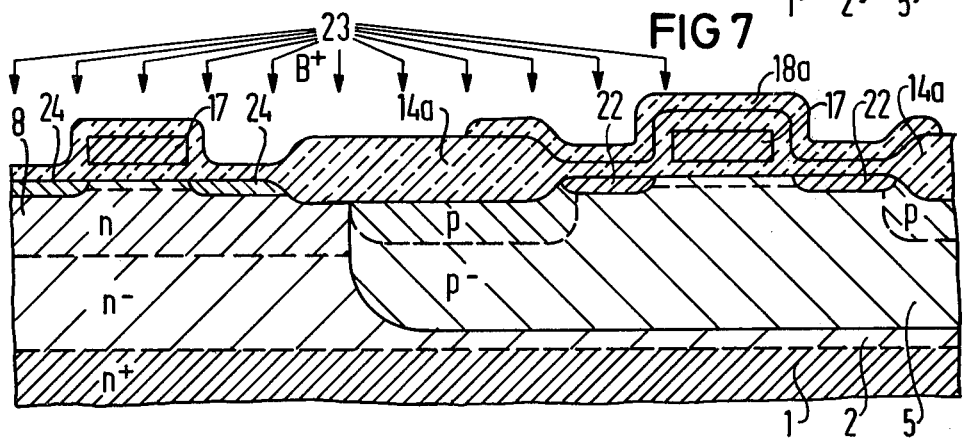

After the phosphorous or arsenic ions for the n-tub 8 have been driven-in, the oxide layer 7 is etched off and oxidation of layer 7a (50 nm) and precipitation of a silicon nitride layer 11 in a thickness of 120 nm, along with structuring of the silicon nitride layer (mask LOCOS) then occur. The field implantation of the p-tub 5 with boron ions, schematically indicated at 10, occurs after masking the n-tub 8 and the entire transistor region of the n-channel transistors in the p-tub 5 with the silicon nitride layer 11. All regions, except the p-tub regions, are covered with a photosensitive resist structure 12 during the boron ion implantation 10. The implantation dose and energy level of the boron ion implantation 10 are set at about $1 \times 10^{13} \text{cm}^{-2}$ and about 25 keV, respectively. The surface edge, indicated with arrow 13 in FIG. 4, is left out of consideration in the following figures.

FIG. 5

After removal of the photosensitive resist structure 12, field oxide regions 14 are generated by local oxidation to a layer thickness of about 1000 nm with the use of the silicon nitride layer 11 as the mask. After stripping the silicon nitride layer 11, a thermal oxidation of the entire surface follows, whereby the thickness of the gate oxide layer 15 is set at about 40 nm (lower than in standard CMOS-processes). A surface-wide boron ion implantation, schematically indicated at 16 then occurs for doping the p-channel and the n-channel. In this implantation step, the dopant dose is selected in agreement with the other implantations in such a manner that as symmetrical as possible threshold voltage $U_T$ is achieved for the n-channel transistor and for the p-channel transistor. In an exemplary embodiment, the implantation dose and energy are set at about $6 \times 10^{11}$ Boron $\text{cm}^{-2}$ and 25 keV respectively, which corresponds to a threshold voltage, $|U_T|$ of 0.8 V. Because the ion implantation occurs surface wide, no mask (in contrast to known CMOS processes) is required.

FIG. 6

Precipitation of a polysilicon level (having a thickness of about 500 nm) and its structuring now occurs whereby gate regions 17 are produced. The entire surface is then thermally oxidized so that, on the one hand, the exposed oxide layer is oxidized-up to a shield oxide 14a and, on the other hand, an approximately 100 nm thick oxide layer 18 grows on the polysilicon regions 17. This thermal oxidation is carried out in such a manner that the oxide layer thickness over the source/drain regions of the n-channel transistors in the p-tub 5 does not mask the later source/drain implantation. This oxide layer (14a, 18) forms the basis for a silicon nitride layer 19 now to be applied and whose thickness is selected in such a manner that it guarantees masking against a subsequent arsenic ion implantation, schematically indicated at 21, for producing the n-channel transistors in the p-tub 5. With the aid of a photosensitive resist structure 20, the silicon nitride layer 19 is structured in such a manner that the regions of the p-channel transistors in the n-tub 8 remain covered by it. The arsenic ion implantation 21 is then executed at a dose of about $6 \times 10^{15} \text{cm}^{-2}$ and at an energy level of about 80 keV and the source/drain regions 22 of the n-channel transistors are produced. In contrast to the method suggested by Motamedi et al, "Design and Evaluation of Ion Implanted CMOS Structures", *IEEE Transactions on Electron Devices,* Vol. ED-27, No. 3, pages 578-583 (1980) wherein separate masks are employed for the n+ and the p30 implantations, which results in a reduced yield, only one mask is employed in the practice of the invention for both source/drain implantations; however, a double implantation in one source/drain diffusion region is not carried out (as in Parillo et al or with the method suggested by De Witt Ong, "An All-Implanted CCD/CMOS Process", *IEEE Transactions on Electrical Devices*, Vol. ED-28, pages 6–12, 1981).

FIG. 7

In a thermal oxidation occurring after the arsenic ion implantation 21 and during which source/drain regions 22 of the n-channel transistors are driven-in, the oxides in the n+ implanted region are further oxidized (layer 18a) up to a thickness which guarantees sufficient masking in a subsequent boron implantation, schematically indicated at 23, for producing the p-channel transistors. In the exemplary embodiment, this thickness amounts to about 250 nm. Because of the still-existing nitride layer 19 this oxidation is practically a second LOCOS step. After removal of the nitride structure 19, the surface-wide boron ion implantation 23 for producing the source/drain regions of the p-channel transistors in the n-tub 8 is carried out. This implantation occurs at a dose and energy level set at $4 \times 10^{15}$cm$^{-2}$ and 25 keV respectively. After driving-in the implanted boron atoms, the source/drain regions 24 of the p-channel transistors are produced.

Production of an insulating layer, contact hole regions and a metal track level then occurs in accordance with known method steps of CMOS technology.

Figure 9:
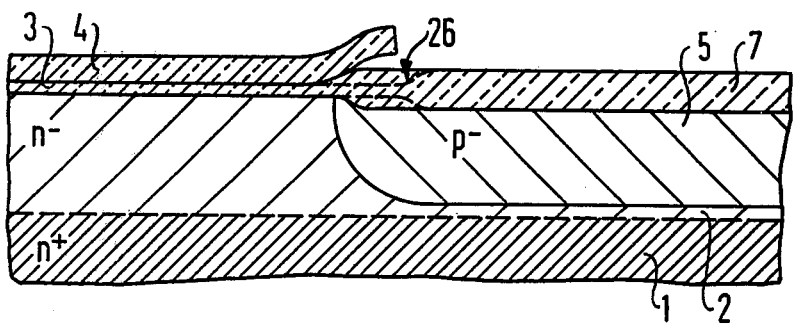

FIGS. 8 and 9

Figure 3:
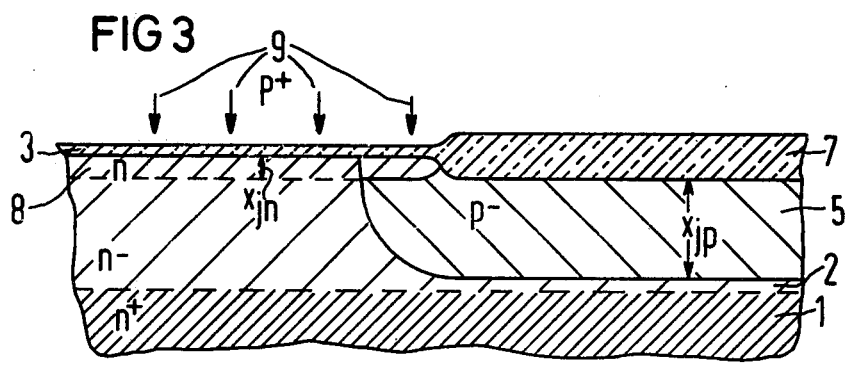

In a subsequent masking oxidation, the high underetching 25 of the silicon nitride mask 4, produced when stripping the oxide layer 3 after conclusion of the boron ion implantation 6 for the production of p-tub 5 (FIG. 1), allows a shift of the edge toward the outside. The implantation of the n-tub 8 (FIG. 3) is separated by this distance (1 to 2 µm) from the implantation edge of the p-tub 5 (see arrow 26 of FIG. 9).

As is apparent from the foregoing specification, the present invention is susceptible of being embodied with various alterations and modifications which may differ particularly from those that have been described in the preceeding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. In a method for producing adjacent tubs implanted with doping material ions in the manufacture of LSI complementary MOS field effect transistor circuits, with which, for the acceptance of the n- or, respectively, p- channel transistors of the circuit in a silicon substrate (1), p-doped or respectively, n-doped tubs (5, 8) are produced in an epitaxial layer (2) applied to the substrate (1), with the corresponding dopant material atoms being introduced into said tubs by means of multiple ion implantations (6, 9, 10, 16, 21, 23) for defining the different transistor threshold voltages and whereby masking for the individual ion implantations occurs by structures composed of a material selected from the group consisting of photosensitive resist, silicon oxide and silicon nitride, wherein the improvement comprises a sequence of the following steps:

(a) producing a p-tub (5) by a boron ion implantation (6) in a n-doped epitaxial layer (2) applied onto a n+ -doped substrate (1) and covered with an oxide layer (3), after carrying out a masking of the remaining regions with a silicon nitride mask (4);

(b) stripping off the oxide layer (3) while undertaking a deliberate underetching (25) of the silicon nitride layer (4);

(c) conducting a local oxidation process and diffusing the implanted boron ions down to a penetration depth $x_{jp}$, which is in the range of the epitaxial layer (2) thickness;

(d) stripping off the silicon nitride mask (4);

(e) producing a n-tub (8) by a implantation (9) of phosphorous or arsenic ions and subsequently diffusing the so-implanted ions to a significantly lower penetration depth $x_{jn}$ than the depth of the p-tub ($x_{jp}$), so that $x_{jp}$ is $\geq 4x_{jn}$.

2. In a method as defined in claim 1 wherein the oxidation process according to step (c) is carried out at a pressure of about 1 to $2 \times 10^6$ Pa and at a temperature in the range of about 700° C.

3. In a method as defined in claim 1 wherein the n+-doped substrate (1) at step (a) is <100> -oriented silicon n+-doped with antimony and has a specific resistance of about 0.01 to 0.1 Ohm.cm.

4. In a method as defined in claim 1 wherein the n-doped epitaxial layer (2) of step (a) is <100> -oriented epitaxial layer having a specific resistance of about 10 to 50 Ohm.cm.

5. In a method as defined in claim 1 wherein the production of the n-tubs (8) at setp (e), an implantation dose of about 8 to $12 \times 10^{11}$cm$^{-2}$ and an energy level of about 160 keV is utilized.

6. In a method as defined in claim 1 wherein the penetration depth $x_{jp}$ of the p-tub (5) at step (c) is not greater than about 6 µm.

7. In a method as defined in claim 1 wherein the penetration depth $x_{jn}$ of the n-tub (8) at step (e) is not greater than about 1.5 µm.

8. In a method as defined in claim 1 wherein for manufacturing CMOS circuits, production of source/drain and gate regions as well as production of an intermediate oxide, an insulating oxide and a track level, after the execution of steps (a) through (e), occurs by a sequence of the following additional steps:

(f) conducting a field implantation for the n-channel transistors in the region of the p-tub (9) after masking the n-tub (8) by a silicon nitride mask (11) and a photosensitive resist mask (12) and of the entire transistor region of the n-channel transistors in the p-tub (5) with a silicon nitride layer (11);

(g) producing a field oxide region (14) by a local oxidation with the use of the silicon nitride layer (11) as masking;

(h) thermally oxidized the entire surface after stripping off the silicon nitride masking (11) for the purpose of adjusting the gate oxide thickness (15);

(i) conducting a surface-wide boron ion implantation (16) for doping the p-channel and the n-channel, with the implantation dose being selected in agreement with the other implantations in such a manner that as symmetrical as possible threshold voltage $U_T$ is attained for the n- and the p- channel transistors;

(j) precipitating and structuring a polysilicon layer for the formation of gate regions (17);

(k) thermally oxidizing the entire surface to such a degree that the oxide layer thickness over the source/drain regions (22) of the n-channel transistors does not mask the later source/drain implantation (21);

(l) precipitating a surface-wide silicon nitride layer (19) masking the source/drain regions (24) of the p-channel transistor in a layer thickness matched to the implantation energy of a subsequent source/drain implantation;

(m) structuring said silicon nitride layer (19) in such a manner that regions of the p-channel transistors remain covered by the silicon nitride layer (19);

(n) conducting an arsenic ion implantation (21) for producing the source/drain regions (22) of the n-channel transistors;

(o) thermally oxidizing the surface to such a degree that the oxide layer of thickness over the source/drain regions (22) of the n-channel transistors is adequate as a masking layer for a subsequent implantation (23) for producing the source/drain regions (24) of the p-channel transistors;

(p) stripping off the nitride layer structures (19);

(q) conducting a surface-wide boron ion implantation (23) for producing source/drain regions (24) of the p-channel transistors; and (r) producing an insulating layer, contact hole regions and a metal track structure level in a known manner.

9. In a method as defined in claim 8 wherein the thickness of the gate oxide layer (15) produced during steps (h) is a maximum of about 40 nm.

10. In a method as defined in claim 8 wherein the oxide layer thickness at step (k) is in a range of about 50 to 200 nm.

11. In a method as defined in claim 8 wherein the thickness of the silicon nitride layer (19) produced during step (1) is in the range of about 50 to 150 nm.

12. In a method as defined in claim 8 wherein the dose and energy level for the source/drain implantation (21) of the n-channel transistor with arsenic during step (n) is in the range of about 3 to $10 \times 10^{15} cm^{-2}$ and about 80 keV, respectively.

13. In a method as defined in claim 8 wherein the oxide layer thickness produced during step (o) is in the range of about 100 to 300 nm.

14. In a method as defined in claim 8 wherein the dose and energy level utilized in the source/drain ion implantation (23) of the p-channel transistor with boron in step (q) is in a range of about 2 to $5 \times 10^{15} cm^{-2}$ and about 25 keV, respectively.

15. In a method for producing adjacent tubs implanted with doping material ions in the manufacture of LSI complementary MOS field effect transistor circuits, with which, for the acceptance of the n- or, respectively, p- channel transistors of the circuit in a silicon substrate (1), p-doped or respectively, n-doped tubs (5, 8) are produced in an epitaxial layer (2) applied to the substrate (1), with the corresponding dopant material atoms being introduced into said tubs by means of multiple ion implantations (6, 9, 10, 16, 21, 23) for defining the different transistor threshold voltages and whereby masking for the individual ion implantations occurs by structures composed of a material selected from the group consisting of photosensitive resist, silicon oxide and silicon nitride, wherein the improvement comprises a sequence of the following steps:

(a) producing a p-tub (5) by a boron ion implantation (6) in a n-doped epitaxial layer (2) applied onto a n+ -doped substrate (1) and covered with an oxide layer (3), after carrying out a masking of the remaining regions with a silicon nitride mask (4);

(b) stripping off the oxide layer (3);

(c) conducting a local oxidation process at a pressure of about 1 to $2 \times 10^6$ Pa and at a temperature in the range of about 700° C. and driving-in the implanted boron ions, down to a penetration depth $x_{jp}$ which is in the range of the epitaxial layer (2) thickness;

(d) stripping off the silicon nitride mask (4);

(e) producing a n-tub (8) by a implantation (9) of phosphorous or arsenic ions and subsequently diffusing the so-implanted ions to a significantly lower penetration depth $x_{jn}$ than the depth of the p-tub ($x_{jp}$), so that $x_{jp}$ is $\geq 4 x_{jn}$.

* * * * *